(12) United States Patent
Farian

(10) Patent No.: US 11,329,656 B2
(45) Date of Patent: May 10, 2022

(54) FREQUENCY SYNTHESISER CIRCUITS

(71) Applicant: Nordic Semiconductor ASA, Trondheim (NO)

(72) Inventor: Lukasz Farian, Trondheim (NO)

(73) Assignee: Nordic Semiconductor ASA

( * ) Notice: Subject to any disclaimer, the term of this patent is extended or adjusted under 35 U.S.C. 154(b) by 0 days.

(21) Appl. No.: 17/413,424

(22) PCT Filed: Dec. 10, 2019

(86) PCT No.: PCT/EP2019/084479
§ 371 (c)(1),
(2) Date: Jun. 11, 2021

(87) PCT Pub. No.: WO2020/120497
PCT Pub. Date: Jun. 18, 2020

(65) Prior Publication Data
US 2022/0052697 A1 Feb. 17, 2022

(30) Foreign Application Priority Data
Dec. 11, 2018 (GB) ..................................... 1820175

(51) Int. Cl.
*H03L 7/089* (2006.01)
*H03L 7/099* (2006.01)
(52) U.S. Cl.
CPC .............. *H03L 7/089* (2013.01); *H03L 7/099* (2013.01)
(58) Field of Classification Search
CPC ................................. H03L 7/089; H03L 7/099
See application file for complete search history.

(56) References Cited

U.S. PATENT DOCUMENTS 5,909,474 A * 6/1999 Yoshizawa ............... H03L 7/07
331/25
6,031,426 A * 2/2000 Yechuri ..................... H03L 7/06
375/376

(Continued)

FOREIGN PATENT DOCUMENTS

EP 1189351 A2 * 3/2002 ............. H03L 7/099
GB 2504500 A * 2/2014 ............... H03L 5/00

OTHER PUBLICATIONS

IPO Search Report under Section 17(5) for GB1820175.6 dated Feb. 1, 2019, 3 pages.

(Continued)

*Primary Examiner* — Adam D Houston
(74) *Attorney, Agent, or Firm* — Klarquist Sparkman, LLP

(57) ABSTRACT

A frequency synthesiser arrangement is arranged to receive a clock input signal and provide an output signal. The frequency synthesiser arrangement comprises: a frequency divider arranged to divide the output signal by a variable number N and output a feedback signal; a phase detector arranged to detect a phase difference between the feedback signal and the clock input signal; a phase alignment circuit portion arranged to determine an overlap of the clock input signal and the feedback signal; and a voltage controlled oscillator which is arranged to receive either a first input derived from the phase detector or a second input from an external reference voltage and to provide the output signal. The phase alignment circuit portion is arranged to provide a control output which determines whether the voltage controlled oscillator receives the first or second input.

21 Claims, 5 Drawing Sheets

(56) References Cited

U.S. PATENT DOCUMENTS

| | | | |
|---|---|---|---|
| 7,590,387 B2* | 9/2009 | Chien | H03L 7/099 455/67.11 |
| 8,487,707 B2* | 7/2013 | Wang | H03L 7/113 331/25 |
| 9,413,366 B2* | 8/2016 | Shanan | H03L 7/099 |
| 9,954,543 B1* | 4/2018 | Chan | H03L 7/099 |
| 10,693,472 B2* | 6/2020 | Kim | H03L 7/0998 |
| 10,763,783 B2* | 9/2020 | Heschl | H03L 7/0898 |
| 11,245,405 B2* | 2/2022 | Gailhard | H03L 7/0891 |
| 2003/0048139 A1* | 3/2003 | Chien | H03L 7/199 331/25 |
| 2003/0050029 A1* | 3/2003 | Kaufmann | H03L 7/099 455/190.1 |
| 2003/0171106 A1* | 9/2003 | Dunworth | H03L 7/099 455/260 |
| 2007/0188249 A1 | 8/2007 | Abadeer et al. | |
| 2007/0188251 A1 | 8/2007 | Kobayashi | |
| 2008/0100385 A1 | 5/2008 | Lin | |
| 2009/0039969 A1* | 2/2009 | Hachigo | H03L 7/099 331/1 R |
| 2011/0074514 A1 | 3/2011 | Marutani | |
| 2011/0254600 A1* | 10/2011 | Kato | H03L 7/1075 327/156 |
| 2011/0316595 A1* | 12/2011 | Bolton | H03L 7/099 327/156 |
| 2012/0056654 A1 | 3/2012 | Lee et al. | |
| 2012/0161835 A1* | 6/2012 | David | H03L 7/146 327/157 |
| 2012/0235719 A1* | 9/2012 | Huang | H03L 7/10 327/157 |
| 2017/0310328 A1 | 10/2017 | Ishibashi | |
| 2018/0191359 A1* | 7/2018 | Petrov | H04B 14/06 |
| 2021/0409030 A1* | 12/2021 | Gailhard | H03L 7/0893 |

OTHER PUBLICATIONS

International Search Report and Written Opinion for PCT/EP2019/084479, dated Mar. 2, 2020, 13 pages.

* cited by examiner

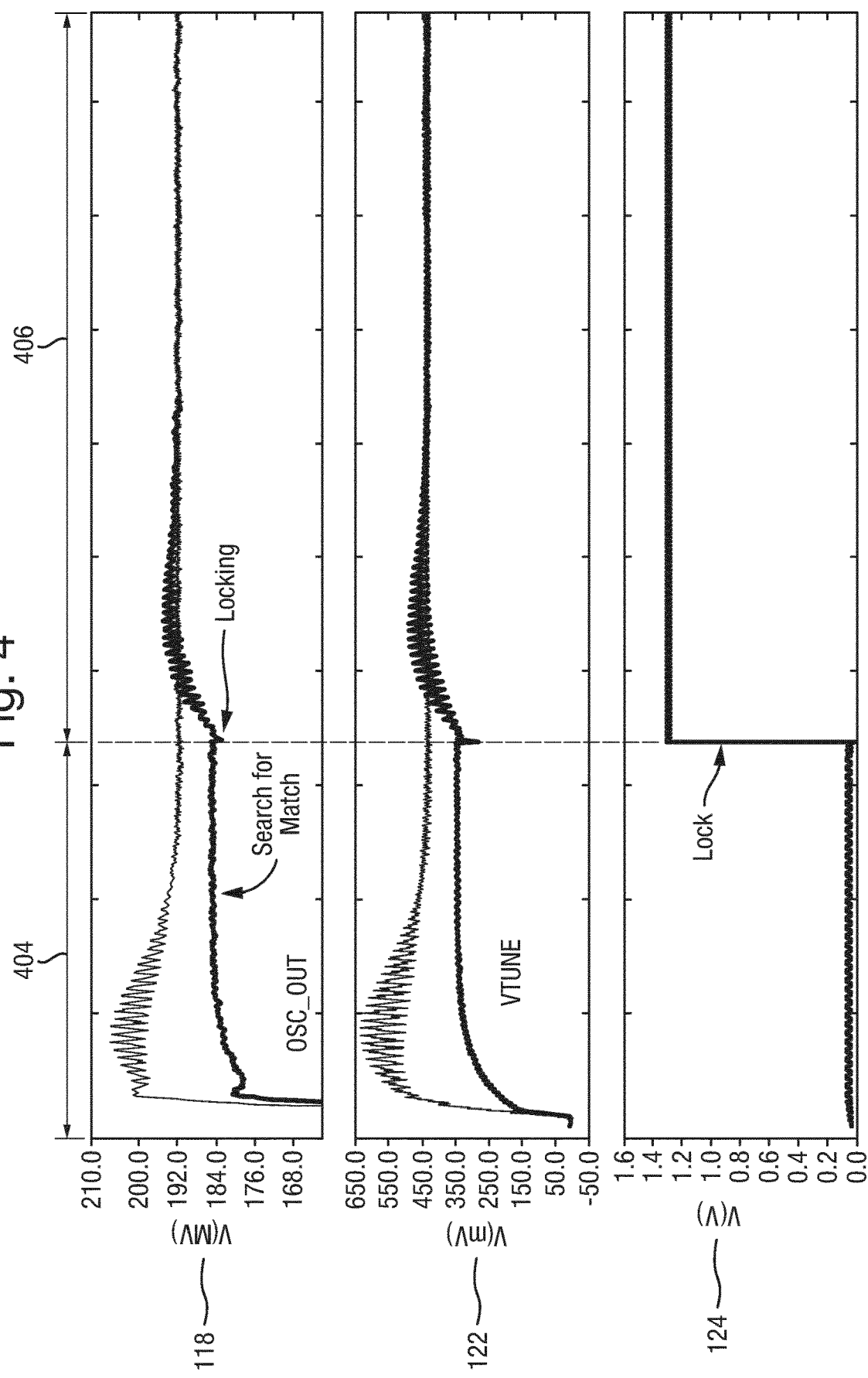

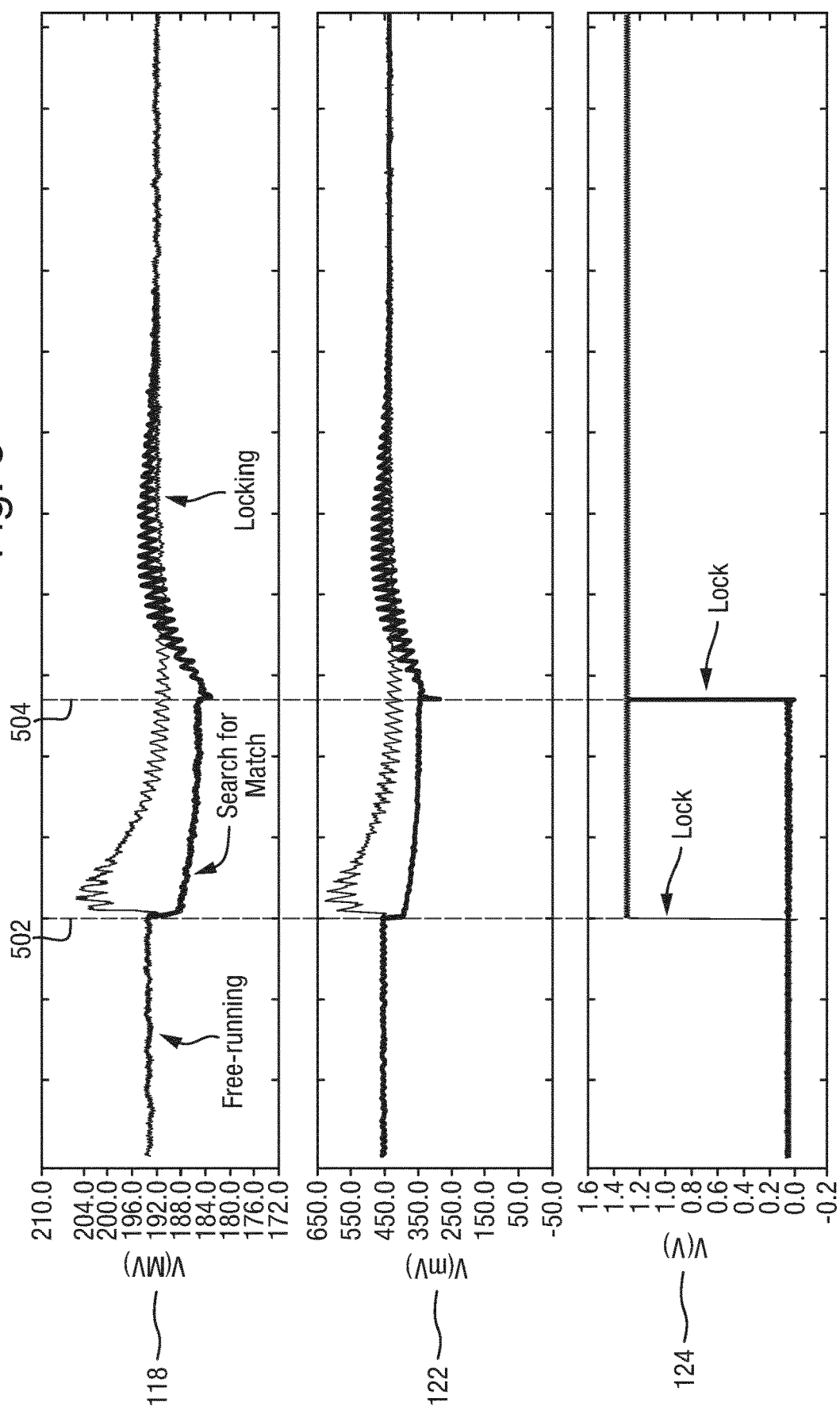

FREQUENCY SYNTHESISER CIRCUITS

CROSS REFERENCE TO RELATED APPLICATIONS

This is the U.S. National Stage of International Application No. PCT/EP2019/084479, filed Dec. 10, 2019, which was published in English under PCT Article 21(2), which in turn claims the benefit of Great Britain Application No. 1820175.6, filed Dec. 11, 2018.

This invention relates to variable frequency divider arrangements, particularly as used in frequency synthesisers and to arrangements for starting them up.

In radio communications, phase locked loop (PLL) circuits use a reference frequency to synthesise various frequencies which are multiples of the reference frequency. This enables transmitters and receivers to be tuned to the required channels. However, phase locked loop circuits are at risk of overshooting the target output frequency during start-up or when changing from one frequency to another. This overshoot can cause significant problems including the failure of a processor due to a timing enclosure violation. Timing enclosure violations are linked to the elements used as combination logic gates having an intrinsic delay. The delays of the entire system have to be considered carefully in order to meet timing requirements of the larger digital system. Synthesis is done with the assumption of a maximal clock frequency that the digital system can handle. Exceeding the assumed maximal frequency can lead to failure of the system.

A common solution is to overdamp the PLL to avoid the overshoot using a large loop filter capacitor.

Whilst an overdamped PLL can lock to the required frequency without overshoot, the time taken to reach the desired output frequency ('lock-time') can be very long. Therefore in prior art PLLs a balance has to be found between the lock-time and the magnitude of overshoot of the target output frequency.

The Applicant has appreciated that it would be advantageous to design a phase locked loop circuit which relaxes such a trade-off between the lock-time and the magnitude of overshoot of the target output frequency.

When viewed from a first aspect the invention provides a frequency synthesiser arrangement arranged to receive a clock input signal and provide an output signal, the arrangement comprising:

a frequency divider arranged to divide the output signal by a variable number N and output a feedback signal;

a phase detector arranged to detect a phase difference between the feedback signal and the clock input signal;

a phase alignment circuit portion arranged to determine an overlap of the clock input signal and the feedback signal;

a voltage controlled oscillator which is arranged to receive either a first input derived from the phase detector or a second input from an external reference voltage and to provide the output signal; wherein the phase alignment circuit portion is arranged to provide a control output which determines whether the voltage controlled oscillator receives the first or second input.

Thus it will be seen by those skilled in the art that in accordance with at least embodiments of this invention, the frequency synthesiser described allows for the voltage controlled oscillator (VCO) to receive different inputs depending on the determined overlap between the clock input signal and feedback signal. This allows for a more appropriate choice of input to the voltage controlled oscillator depending on the proximity of the instantaneous frequency output of the circuit to the desired output frequency. Such control enables the frequency overshoot of the desired output frequency during start-up or transition from free-running mode to locked mode to be minimized. In accordance with embodiments of the invention a shorter start-up time can be achieved without overdamping of the PLL circuit. Furthermore the start-up time of a frequency synthesiser is better-controlled, resulting in more predictable start-up times regardless of loop filter bandwidths.

Determining an overlap of the clock input signal and the feedback signal may refer to a comparison of the instantaneous values (e.g. high or low) of the clock input signal and the feedback signal over a period of time. The overlap of the signals may be determined by comparing the instantaneous values (e.g. high or low) of the signals to each other, e.g. to determine whether the instantaneous values match. This is different to comparing derived values such as the frequency and/or the phase of the inputs. For example, two signals may have the same frequency but have a phase difference, therefore these signals would not have the same instantaneous values over a particular period of time and would not be determined to overlap during this period.

Determining the overlap of the clock input signal and the feedback signal may provide a simple comparison to ensure that the signals are closely aligned before the arrangement is switched (e.g. from the transitional free-running mode) to the locked mode. This may decrease the time taken for the frequency synthesiser arrangement to provide the desired output frequency, for example decreasing the start-up time and reducing the power consumption of the frequency synthesiser.

Whilst the Applicant has envisaged that it is possible to use a fractional divider, in a set of embodiments the variable number N is an integer. This may be easier to implement as an integer divider allows for a simpler counter based implementation.

In a set of embodiments the control output from the phase alignment circuit portion determines whether the arrangement is in a transitional free-running mode or locked mode. The transitional free-running mode corresponds to the voltage controlled oscillator receiving the second input from the reference voltage, therefore the voltage controlled oscillator temporarily receives no feedback from the circuit. In transitional free-running mode the output of the voltage controlled oscillator and therefore the circuit is thus determined by the external voltage. Preferably, the external voltage is static. For example, the external voltage may have a fixed value when the arrangement is in the transitional free-running mode. This contrasts with control words, which would typically vary during operation.

Locked mode corresponds to the voltage controlled oscillator receiving the first input derived from the phase detector, therefore the voltage controller oscillator is provided with feedback via a frequency divider as is seen in conventional PLL circuits.

The phase alignment circuit portion utilizes the determined overlap between the clock input signal and the feedback signal to determine whether the voltage controlled oscillator receives the first or second input. This allows the PLL to be in the transitional free-running mode during start-up, when the output frequency of the frequency synthesiser is significantly different to the desired output frequency and feedback signal is out of phase with the clock input signal, and to switch to locked mode only when the frequencies are closer and the feedback signal and clock input signal are acceptably close to being in phase.

In a set of embodiments the phase alignment circuit portion determines whether the overlap between the clock input signal and feedback signal is below a predetermined threshold. If the overlap is below the threshold the input to the voltage controlled oscillator is selected by the phase alignment circuit portion to be the second input e.g. from a reference voltage (transitional free running mode). The reference voltage is typically static whilst the frequency synthesiser is in transitional free running mode. In a set of embodiments wherein the frequency synthesiser arrangement is in the transitional free-running mode the reference voltage corresponds to an output frequency of the VCO in the range of 1-20% e.g. 5-15% e.g. 10% less than a target output signal of the frequency synthesiser arrangement. Using a reference voltage which corresponds to a frequency which is lower than the target lock frequency lowers the risk of overshooting of the target lock frequency, longer start-up and the problems associated with overshooting.

In such embodiments, when the phase aligning circuit portion determines the degree of overlap to be higher than or equal to the predetermined threshold, the input to the voltage controlled oscillator (also known as the tuning signal) is selected by the phase alignment circuit portion to be the first input derived from the phase detector (locked mode) by setting the control output to a lock signal. Implementing the locked mode once the phases of the feedback signal and clock input signal are suitably aligned enables quick and accurate fine tuning to the desired frequency signal.

In a set of embodiments the control output is also used to initiate the phase detector. In a subset of these embodiments the phase detector is falling edge triggered and the control output of the phase alignment circuit portion is arranged to provide a lock signal on a falling edge of the feedback signal. Enabling the phase detector on the falling edge of the feedback signal may ensure that the phase detector detects the feedback signal lagging compared to the clock input signal and thus that it begins by providing an output (tuning signal) which tends to increase the frequency of the output signal. It is also possible for the phase detector to be positive edge triggered and in this case the phase detector should be enabled on the positive edge of the feedback signal.

In a set of embodiments the predetermined threshold is in the range of 55-95% e.g. 60-80%, e.g. 65-75% e.g. 70% overlap between the clock input signal and the feedback signal. This advantageously allows the output to reach a frequency closer to the target lock frequency than is seen in conventional PLL circuits before changing to the first input derived from the phase detector. However the predetermined threshold can be adjusted depending on the design and the required properties of the frequency synthesiser. For example, if the predetermined threshold is set to 90%, the frequency synthesiser may take longer to reach the required frequency, but any risk of overshoot would be further reduced.

The phase alignment circuit portion disclosed herein may be used to start up the frequency synthesiser arrangement. Thus when viewed from a second aspect the invention provides a method of starting-up the frequency synthesiser arrangement, as set out in the first aspect of the invention, comprising the phase alignment circuit portion:

initially setting the control output so as to result in the second input being received by the voltage controlled oscillator;

determining the overlap of the clock input signal and the feedback signal; and when the overlap of the clock input signal and the feedback signal is equal to or above a predetermined threshold, setting the control output so as to result in the first input being received by the voltage controlled oscillator.

Additionally or alternatively it may be used when switching from a persistent free running mode of operation to a locked mode of operation. The persistent free running mode referred to above is one which may be used for specific operations within the device (e.g. when the frequency stability is less critical and therefore it is not necessary to provide the reference clock) and may persist indefinitely. This contrasts with the transitional free running mode employed temporarily in accordance with the invention until a predetermined overlap is achieved. Although such a transition from a persistent free-running to a locked mode does not involve a change of ultimate frequency, in accordance with a set of embodiments the external voltage received at the second input is reduced when moving from the persistent free-running mode to the transitional free-running mode e.g. by 1-20%, 5-15% or 10%, compared to a reference voltage applied during said persistent free running mode. Thus when viewed from a third aspect of the invention provides a method of changing a mode of operation of the frequency synthesiser arrangement, as set out in the first aspect of the invention; comprising:

providing a constant voltage to the voltage controlled oscillator;

the phase alignment circuit portion initially setting the control output so as to result in the second input being received by the voltage controlled oscillator, wherein the external reference voltage is lower than the constant voltage;

the phase alignment circuit portion determining the overlap of the clock input signal and the feedback signal; and when the overlap of the clock input signal and the feedback signal is equal to or above a predetermined threshold, setting the control output so as to result in the first input being received by the voltage controlled oscillator.

In a set of embodiments the phase alignment circuit portion comprises:

a comparator arranged to perform a comparison between the clock input signal and the feedback signal; and a storage portion arranged to store results of the comparison, wherein the phase alignment circuit portion is arranged to alter the control output to provide a lock signal when the results from the comparison indicate that the clock input signal and the feedback signal are the same for a predetermined number of cycles of the output signal.

The Applicant has appreciated the arrangement of the phase alignment circuit portion is novel and inventive in its own right. Therefore, when viewed from a fourth aspect, the invention provides a phase alignment circuit portion clocked by an output signal from a frequency synthesiser circuit portion comprising:

a comparator arranged to perform a comparison between a clock input signal and a feedback signal from the frequency synthesiser circuit portion; and a storage portion arranged to store results of the comparison, wherein the phase alignment circuit portion is arranged to alter a control output to provide a lock signal when the results from the comparison indicate that the clock input signal and the feedback signal are the same for a predetermined number of cycles of said output signal.

In a set of embodiments, the comparator comprises an exclusive NOR gate arranged to determine an overlap of the clock input signal and the feedback signal.

In a set of embodiments of any of the aspects of the invention the phase alignment circuit portion comprises:

an exclusive NOR gate receiving the clock input signal and the feedback signal as inputs;

an inverter receiving the feedback signal as an input;

a first flip-flop receiving an input from the exclusive NOR gate and clocked by the output signal;

a first AND gate receiving inputs from the exclusive NOR gate and the first flip-flop;

at least one further flip-flop receiving an input from the first or a preceding flip-flop and clocked by the output signal; and at least one further AND gate receiving inputs from the first or a preceding AND gate and the further flip-flop.

In these embodiments the phase alignment circuit portion determines whether the clock input signal and feedback signal have overlapped for a predetermined number of cycles of the output signal using simple logic gates. The clock input signal and feedback signal are supplied as inputs to the exclusive NOR gate. The instantaneous output of the exclusive NOR gate output is '1' when both the clock input signal and the feedback signal have the same value i.e. both have simultaneous value of '1' or both have a simultaneous value of '0'. The instantaneous output of the exclusive NOR gate is '0' when the clock input signal and the feedback signal have different values i.e. one signal has a value of '0' whilst the other has a value of '1'. The exclusive NOR gate therefore acts as the comparator referred to above.

The output from the exclusive NOR gate is fed into the input of the first flip-flop. The first flip-flop is clocked by the output signal of the frequency synthesiser. Periodically (e.g. on the rising edge of the output signal), the instantaneous value of the flip-flops input is transferred to its output. This output is input to the further flip-flop and to the first AND gate. The output of the AND gate is only '1' if both the inputs, i.e. the output from the first flip-flop and the output of the exclusive NOR gate, have a simultaneous value of '1'. The further flip-flop is also clocked by the output signal. The further flip-flop functions in the same manner as the first flip-flop. The output from the further flip-flop provides an input to the further AND gate. The further AND gate only gives an output of '1' when the values of inputs received from the first AND gate and the further flip-flop are both '1'.

In the embodiment described above, when the first and further flip-flops both produce output signals with a value of '1'. this indicates that the clock input signal and feedback signal have been found to have overlapped for at least two cycles of the output signal. The output from the further AND gate can only be '1' if both the previous cycles indicated an overlap.

Further AND gate/flip-flop pairs could be provided. For example, in a set of embodiments the phase alignment circuit comprises an additional flip-flop and an additional AND gate which would give a '1' signal only if the clock input signal had overlapped for at least three cycles of the output signal. In a set of embodiments the phase alignment circuit comprises a plurality of flip-flops, each configured in a serial arrangement, receiving an input from the previous flip-flop, and a plurality of AND gates receiving an input from the corresponding flip-flop and the previous AND gate.

Increasing the number of flip-flop AND gate pairs increases the number of cycles over which the clock input signal and feedback signal must overlap in order to switch the frequency synthesiser from free-running to locked mode. This is due to an increased number of AND gates and flip-flops which must be outputting a signal with a value of '1' in order for the final AND gate to output a value of '1'. Each consecutive additional flip-flop is also clocked by the output signal. The output value from the first flip-flop propagates along the chain of flip-flops, moving to the next flip-flop every time the flip-flops in the chain are clocked by a cycle of the output signal. As the output of each flip-flop must be '1' for the locking signal to be produced (i.e. the output of the phase alignment circuit to be a '1'), should the clock input signal and feedback signal not match instantaneously when the first flip-flop is clocked by the output signal, this will cause the propagation of a '0' signal through the flip-flop chain. Therefore adding additional flip-flops equates to confirming the clock input signal and feedback signal overlap for additional cycles of the output signal.

In a set of embodiments the phase alignment circuits further comprises a final flip-flop receiving inputs from the inverter, which results in the final flip-flop being clocked by an inverted version of the feedback signal, and a final one of the AND gates. This ensures that an output from the final flip-flop indicates whether the clock input signal and feedback signal have overlapped for a predetermined number of cycles of the output signal but will only provide the lock signal to switch the circuit from transitional free-running to locked mode on the falling edge of the feedback signal. As previously explained, this is beneficial for stability when, as is preferred, the lock signal is also used to initiate a falling edge-triggered phase detector.

In a set of embodiments the phase alignment circuit portion is arranged to be disabled once its control output is altered to provide the lock signal. This could be achieved for example by using an OR gate to gate the output signal clocking the flip-flops, said OR gate receiving a further input from the control output such that it's output is held high when the lock signal is provided. This prevents the flip-flops operating and thus consuming power.

It will be appreciated by those skilled in the art that the invention extends to all logically equivalent or logically inverted arrangements of those set out herein.

In a set of embodiments the number of flip-flops and AND gates are chosen based on the feedback divider ratio of the frequency synthesiser circuit portion, where NoE is the number of flip-flop gates and AND gate pairs, N is the feedback divider ratio and Ov is the predetermined overlap threshold over which the clock input signal and feedback signal have to match: NoE=[N*Ov]. (the square brackets indicate the nearest integer is chosen). This equation demonstrates the relationship between the overlap required between the clock input signal and the feedback signal, and the number of flip-flops in the phase alignment circuit portion. Therefore, as the Applicant has appreciated, it is possible to have different frequency synthesiser arrangements in which different overlaps are required for the arrangement to enter locked mode. This allows for more flexibility in where the arrangement is used.

Certain embodiments of the present invention will now be described, by way of example only, with reference to the accompanying drawings in which.

FIG. 4 is a graph of the output signal, the tuning signal and the output of the phase alignment circuit portion (lock signal) against time in an exemplary start-up procedure for both the disclosed invention and a conventional frequency synthesiser; and FIG. 5 is a graph of the output signal, the tuning signal and the output of the phase alignment circuit portion (lock signal) against time in a proposed procedure for switching from the free running made to the locked mode.

Figure 1:
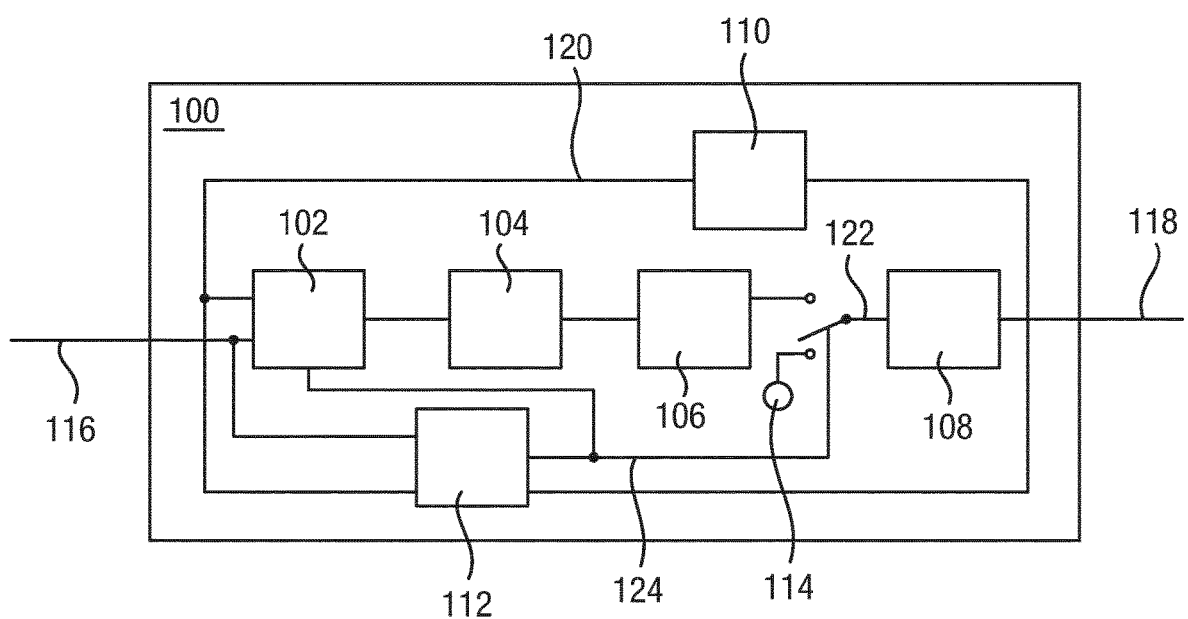
FIG. 1 is a circuit diagram of a variable frequency divider arrangement embodying the invention.

FIG. 1 shows the frequency synthesiser circuit arrangement of an embodiment of the invention. In common with a conventional phase-locked loop (PLL), the frequency synthesiser 100 as seen in FIG. 1 has the following components: a phase frequency detector (PFD) 102, a charge pump (CP) 104, a loop filter (LP) 106, a voltage controlled oscillator (VCO) 108 and a frequency divider (DIV) 110. As will be described in more detail later, this embodiment of the invention also comprises a phase alignment circuit portion 112 which controls a switch 113 that determines the input to the VCO 108 and also controls activation of the PFD 102. The frequency synthesiser unit 100 has an input in the form of a clock input signal 116, and provides an output signal 118.

When the switch 113 is in its upper position so that the output of the loop filter 106 is fed to the input of the VCO 108, the circuit 100 acts as a conventional PLL whereby the output of the VCO 108 is divided by a number N by the divider 110 to produce a feedback signal 120. The feedback signal 120 is then fed back to the PFD 102 which compares this to the clock input signal 116 to obtain information about the phase difference between the signals. Depending on the polarity and the magnitude of the difference, the PFD 102 controls the charge pump 104 by outputting signals to increase or decrease the input voltage fed to the VCO 108 via the loop filter 106, to bring the output signal 118 closer to the frequency of the clock input signal 116 multiplied by N.

In contrast with conventional PLLs however, the frequency synthesiser 100 further includes a phase alignment circuit portion 112 utilized for controlling whether the synthesiser is in a transitional free-running mode or locked mode. The control output 124 of the phase alignment circuit portion 112 is a lock signal which is binary. When the lock signal 124 is '0', the switch 113 is in its lower position so that a reference voltage 114 is fed to the input to the VCO 108. When the frequency synthesiser is in the transitional free-running mode this reference voltage 114 corresponds to a frequency approximately 10% below the desired frequency synthesiser arrangement clock output. In this configuration the PFD 102 is disabled. When the lock signal 124 is '1', the switch is in its upper position so that the circuit 100 acts as a conventional PLL as previously described. In this configuration the PFD 102 is activated by the lock signal 124 and the frequency synthesiser 100 is in the 'locked mode'. The arrangement then locks to the desired frequency in the same manner as a conventional phase locked loop circuit.

When the frequency synthesiser arrangement 100 starts-up, the phase alignment circuit portion 112 measures the extent of the overlap between the clock input signal 116 and the feedback signal 120. When the overlap between the clock inputs is below a predetermined threshold, the control output 124 of the phase alignment circuit portion 112 is '0' i.e. the circuit is in free-running mode. When the overlap between the clock inputs is equal to or greater than a predetermined threshold, the output of the phase alignment circuit portion 112 changes to '1' i.e. the circuit is put into locked mode. The predetermined threshold is a 70% overlap is certain embodiments.

The circuit starts up in the transitional free-running mode. As the time period over which the circuit has been running increases, the overlap approaches the predetermined threshold. When the overlap becomes equal to or greater than the predetermined threshold, the PFD 102 is enabled on the falling edge of the output of the frequency divider to the variable to ensure the PFD 102 'observes' a lagging feedback signal 120, therefore the PFD 102 will begin by correctly increasing the tuning signal to the VCO 108 from $V_{ref}$ towards the a value which causes it to approach the target frequency of the output signal (118).

Figure 2:
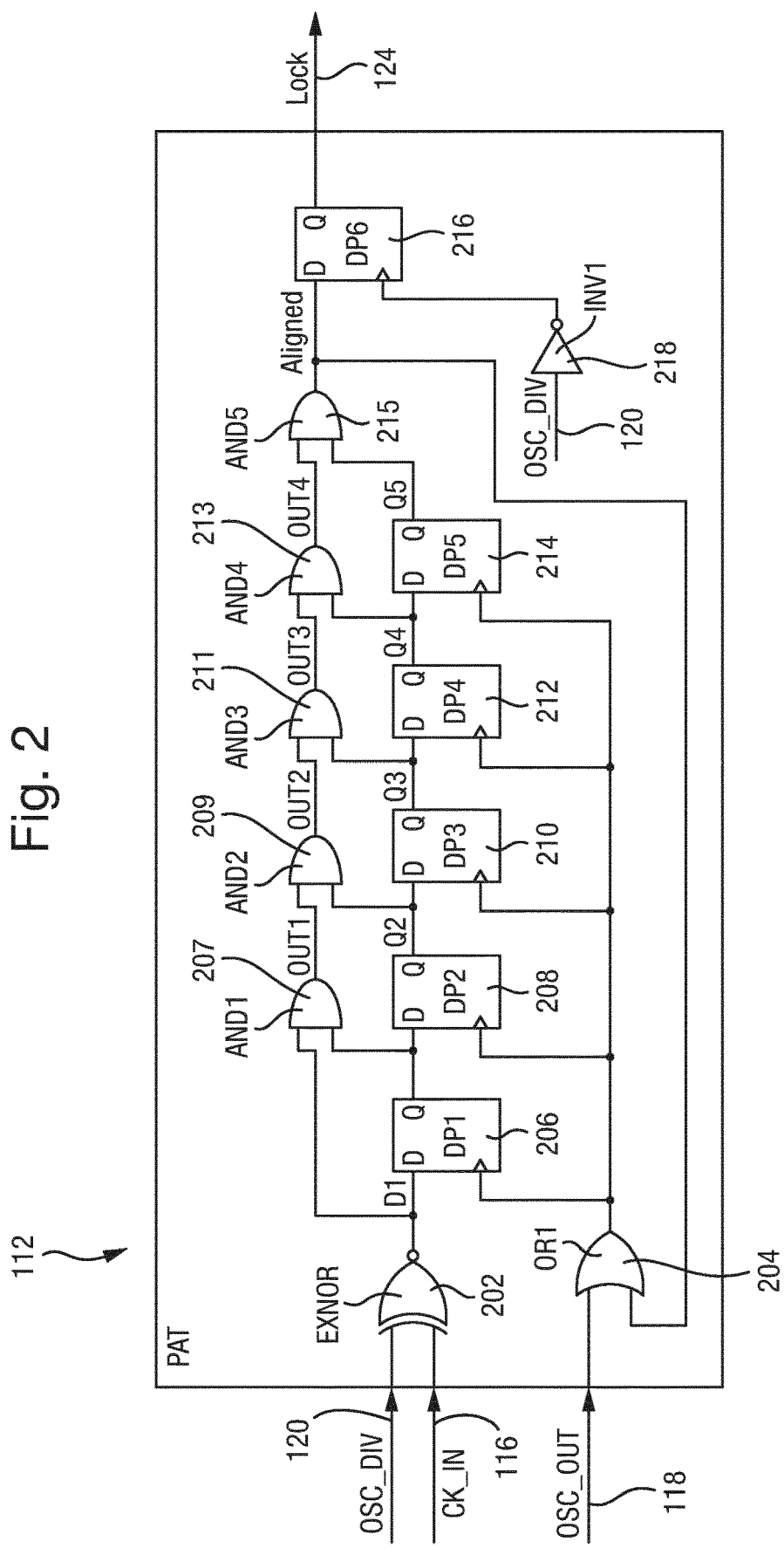
FIG. 2 is a more detailed circuit diagram of the phase alignment circuit of the variable frequency divider of FIG. 1.

The phase alignment circuit portion 112 is shown in more detail in FIG. 2. It comprises an exclusive NOR gate 202, an OR gate 204, five D-type flip-flop gates arranged in series 206, 208, 210, 212, 214, a final flip-flop 216, five AND gates 207, 209, 211, 213, 215 and an inverter 218.

The clock input signal 116 and the feedback signal 120 are input into the exclusive NOR gate 202. The output of the exclusive NOR gate 202 is only high i.e. '1' when the clock input signal 116 and the feedback signal 120 have the same instantaneous value. The output of the exclusive NOR gate 202 is connected to the D input of the first of the chain of D-type flip-flops in series 206 with the Q-output thereof connected to the D-input of the next flip-flop 208 and so on. The flip-flops 206, 208, 210, 212, 214 are clocked by the output signal 118, such that the value of the D input is only captured/transferred to the Q-output of a flip-flop on the rising edge of the output signal 118. The output of each flip-flop 206, 208, 210, 212, 214 is also connected to the corresponding AND gates 207, 209, 211, 213, 215. The output value from the first flip-flop 206 propagates along the chain of flip-flops 208, 210, 212, 214 moving to the next flip-flop every time the flip-flops in the chain are clocked by a cycle of the output signal 118. As the output of each flip-flop must be 1 for the locking signal to be produced (i.e. the control output 124 of the phase alignment circuit to be a 1), should the clock input signal 116 and feedback signal 120 not match instantaneously when the first flip-flop 206 is clocked by the output signal 118, this will cause the propagation of a '0' signal through the flip-flop chain and thus suppresses the lock signal. In such an arrangement the output of the fifth AND gate 215 is high (e.g. '1') only when the clock input signal 116 and the output feedback signal 120 have been overlapping during at least 5 cycles of the output clock.

The final flip-flop 216 ensures that the control output 124 of the phase alignment circuit portion 112 toggles high on the falling edge of the output of the frequency divider (to ensure the PFD 'observes' a lagging feedback signal when it is initiated). The output signal from the final AND gate 215 is connected to an input of the OR gate 204. Therefore when the output 215 is '1', the output of the OR gate will also be held at '1'. This prevents the flip-flops from being clocked by the output signal 118 to prevent unnecessary power consumption of the phase alignment circuit portion once the clock input signal 116 and the feedback signal 120 have 'matched' during five cycles of the output clock.

In order for the clock input signal 116 and feedback signal 120 to be considered to have an overlap equal to or greater than the predetermined threshold, the signals must be in phase for five cycles of the output signal 118. The number of flip-flop gates and AND gates are chosen depending on the extent of the overlap required as given by the following equation:

$$NoE=[N*Ov]$$

Where NoE is the number of flip-flop gates and AND gate pairs which is set to be the nearest integer to the product of N, the feedback divider ratio and Ov, the predetermined overlap threshold over which the clock input signal 116 and feedback signal 120 have to match.

Figure 3:
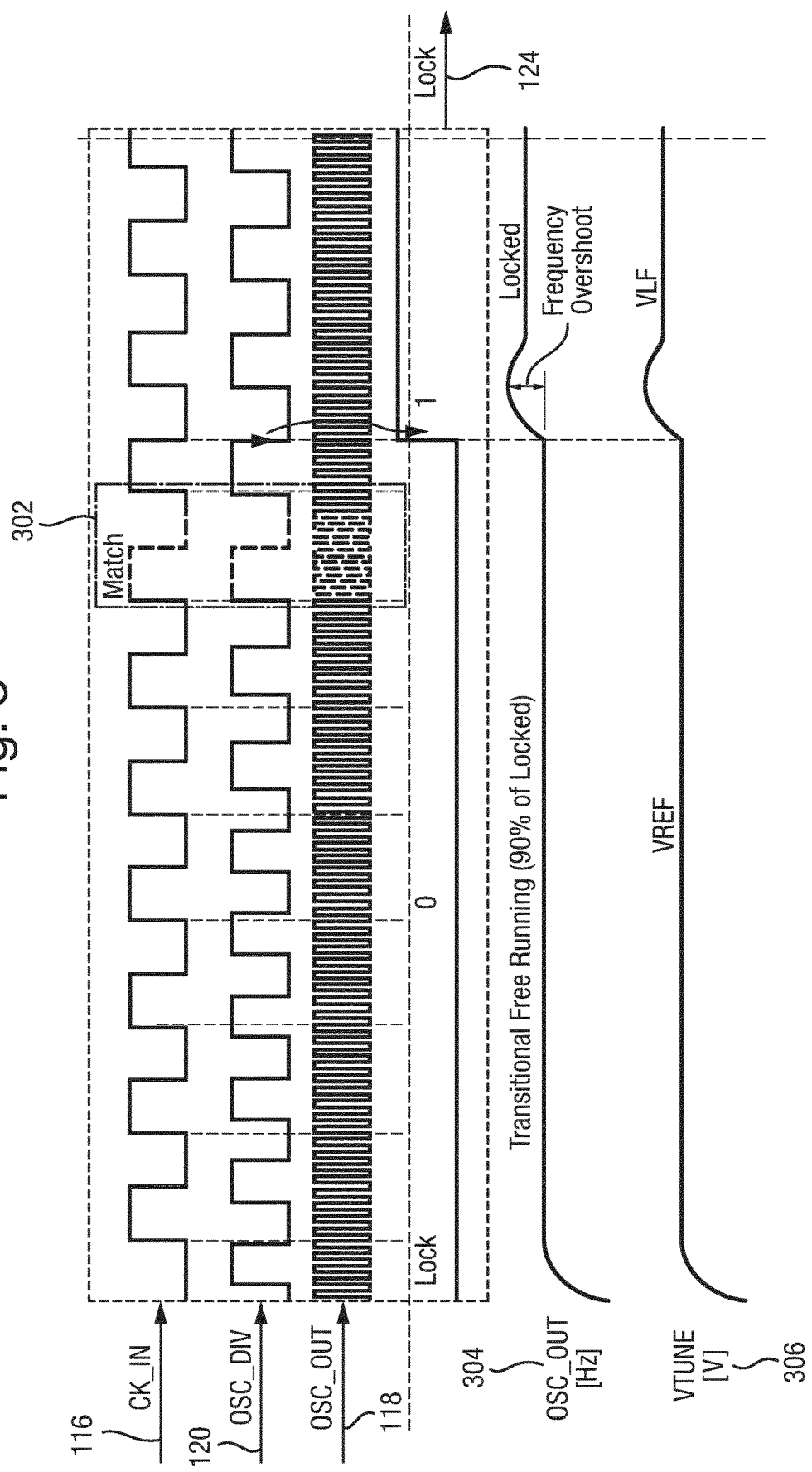
FIG. 3 is diagram of the clock input signal, the output, and the feedback signal of the variable divider arrangement in an exemplary start-up procedure.

FIG. 3 demonstrates an overlap being detected between the clock input signal 116 and the feedback signal 120 over a predetermined number of cycles of the output signal 118 of the VCO. The control output signal 124 of the phase alignment circuit portion starts low (i.e. '0'). To start with, the clock input signal 116 and the feedback signal 120 have some degree of overlap but do not demonstrate overlap for a continuous period of five cycles of the output signal 118. However as the feedback signal 120 is brought into line with the feedback signal 120, section 302 shows five cycles of the output signal 118 in dashed lines for which the instantaneous values of the clock input signal 116 and feedback signal 120 match. Section 302 also shows the delay in the control output 124 signal going high after the instantaneous values of the clock input signal 116 and feedback signal 120 have been found to overlap for five cycles of the output signal 118 as a result of the final flip-flop 216. Once a match has been found, the control output 124 signal does not switch from low (i.e. '0') to high (i.e. '1') until the falling edge of the feedback signal 120 to ensure the PFD 102 'observes' a lagging feedback signal when it is activated.

FIG. 3 also demonstrates the change in the frequency of the output signal 118 of the VCO during the detection of the overlap between the clock input signal 116 and feedback signal 120 in the plot 304. The change in the voltage of the tuning signal 122 during the detection of the overlap is also shown in the plot 306. There is an increase in both the frequency of the output signal 118 and the voltage of the tuning signal 122 when the locking signal 124 switches from low (i.e. '0') to high (i.e. '1').

FIG. 4 illustrates an exemplary start-up procedure of the frequency arrangement as described in accordance with the invention (represented on the graphs as the bolder line), compared to a conventional frequency synthesiser set up which does not utilize a phase alignment technique circuit portion (represented on the graphs as the lighter line).

When the conventional frequency synthesiser, as depicted as the lighter line in the graphs, is turned on at the start of section 404, there is a sharp increase in the frequency of the output of the frequency synthesiser which causes it to overshoot the desired output frequency. This is followed by a period of relatively large oscillations in the frequency of the output. This is caused by loop dynamics and cycle slipping inside the PFD due to a large phase error during start-up. The frequency of the output then tends towards the desired frequency of the output signal. The variation in the tuning signal to the VCO follows a similar pattern to the output signal 118, as seen in the second middle graph of FIG. 4.

In a frequency synthesiser arrangement in accordance with the invention, the frequency synthesiser initially enters the transitional free-running mode when it is turned on at the start of section 404. This is observed in the first phase of the graph 404, where the phase alignment circuit portion 112 searches for an overlap between the clock input signal 116 and the feedback signal 120 equal to or greater than the predetermined five cycle threshold. The increase in frequency of the output signal is smaller than that seen using a conventional frequency synthesiser circuit due to the reference voltage input into the VCO in the transitional free-running mode corresponding to a frequency lower than the desired output frequency. The output signal exhibits a lower overshoot during start-up as the PFD 102 observes a smaller phase error compared to conventional frequency synthesisers.

Once the phase alignment technique portion of the circuit has determined there is sufficient overlap between the clock input signal 116 and the feedback signal 120, the lock signal 124 goes high (i.e. '1') and the switch 113 is flipped to its upper position. In the second, 'locking' phase 406 seen in FIG. 4 the frequency of the output signal gradually tends towards the desired frequency with little overshoot. Overshoot of the output frequency is reduced by approximately 5 times when the phase alignment circuit portion 112 is employed compared to the conventional PLL.

The proposed techniques can also be used when a frequency synthesiser is initially operating in a persistent free-running mode and it is desirable to switch it to a locked mode. This process is shown in FIG. 5 for both an embodiment of the invention disclosed (the bolder line plot) and a conventional frequency synthesiser without the phase alignment circuit portion (the lighter line plot). At point 502, the conventional frequency synthesiser is switched straight from the persistent free-running mode to the locked mode, as can be seen from the lock signal going from 0 to 1 at point 502. This results in a large, sudden increase in the frequency of the output signal and large fluctuations as the circuit locks to the desired output frequency as previously described in the context of starting up the circuit.

In the frequency synthesiser in accordance with the invention however, point 502 corresponds to switching from a persistent free-running mode to a transitional free-running mode, which is entered prior to entering locked mode as in the previous embodiment. This triggers the phase alignment circuit portion to be implemented and simultaneously the reference voltage to be lowered by 10% to ensure that the desired output signal voltage is not overshot. The phase alignment circuit portion searches for an overlap equal to or greater than a predetermined threshold between the clock input signal 116 and the feedback signal 120. At point 504 the phase alignment technique portion of the circuit determines there is sufficient overlap between the clock input signal 116 and the feedback signal 120, the frequency synthesiser enters locked mode. This is also seen in the corresponding lock signal 124 which changes from 0 to 1 at point 504. The frequency of the output signal gradually tends towards the desired frequency with little overshoot.

Thus it will be appreciated by those skilled in the art that the specific embodiments of the inventive concepts described herein provide a frequency synthesiser which relaxes the trade-offs required in the prior art between lock-time and the magnitude of overshoot of the desired output frequency. This may provide significant benefits over known systems. It will further be appreciated that many variations of the specific arrangements described here are possible within the scope of the invention.

The invention claimed is:

1. A frequency synthesiser arrangement arranged to receive a clock input signal and provide an output signal, the arrangement comprising:
   a frequency divider arranged to divide the output signal by a variable number N and output a feedback signal;
   a phase detector arranged to detect a phase difference between the feedback signal and the clock input signal;
   a phase alignment circuit portion arranged to determine an overlap of the clock input signal and the feedback signal;
   a voltage controlled oscillator which is arranged to receive either a first input derived from the phase detector or a second input from an external reference voltage and to provide the output signal;
   wherein the phase alignment circuit portion is arranged to provide a control output which determines whether the voltage controlled oscillator receives the first or second input.

2. The frequency synthesiser arrangement as claimed in claim 1 wherein the control output determines whether the arrangement is in a transitional free-running mode or locked mode.

3. The frequency synthesiser arrangement as claimed in claim 2 wherein the transitional free-running mode corresponds to the voltage controlled oscillator receiving the second input from the reference voltage.

4. The frequency synthesiser arrangement as claimed in claim 2 wherein the locked mode corresponds to the voltage controlled oscillator receiving the first input derived from the phase detector.

5. The frequency synthesiser arrangement as claimed in claim 1 wherein the phase alignment circuit portion utilizes the determined overlap between the clock input signal and the feedback signal to determine whether the voltage controlled oscillator receives the first or second input.

6. The frequency synthesiser arrangement as claimed in claim 1 wherein the phase alignment circuit portion determines whether the overlap between the clock input signal and feedback signal is below a predetermined threshold.

7. The frequency synthesiser arrangement as claimed in claim 6 wherein the predetermined threshold is in the range of 55-95% overlap between the clock input signal and the feedback signal.

8. The frequency synthesiser arrangement as claimed in claim 1 wherein the reference voltage corresponds to an output frequency of the VCO in the range of 1-20% less than a target output signal of the frequency synthesiser arrangement.

9. The frequency synthesiser arrangement as claimed in claim 1 wherein the control output is also used to initiate the phase detector.

10. The frequency synthesiser arrangement as claimed in claim 9 wherein the phase detector is falling edge triggered.

11. The frequency synthesiser arrangement as claimed in claim 9 wherein the control output of the phase alignment circuit portion is arranged to provide a lock signal on a falling edge of the feedback signal.

12. The frequency synthesiser arrangement as claimed in claim 1 wherein the phase alignment circuit portion comprises:
a comparator arranged to perform a comparison between the clock input signal and the feedback signal; and
a storage portion arranged to store results of the comparison, wherein the phase alignment circuit portion is arranged to alter the control output to provide a lock signal when the results from the comparison indicate that the clock input signal and the feedback signal are the same for a predetermined number of cycles of the output signal.

13. A phase alignment circuit portion clocked by an output signal from a frequency synthesiser circuit portion comprising:
a comparator arranged to perform a comparison between a clock input signal and a feedback signal from the frequency synthesiser circuit portion; and
a storage portion arranged to store results of the comparison, wherein the phase alignment circuit portion is arranged to alter a control output to provide a lock signal when the results from the comparison indicate that the clock input signal and the feedback signal are the same for a predetermined number of cycles of said output signal.

14. The phase alignment circuit portion, as claimed in claim 13 wherein the comparator comprises an exclusive NOR gate arranged to determine an overlap of the clock input signal and the feedback signal.

15. The phase alignment circuit portion as claimed in claim 13 wherein the phase alignment circuit portion comprises:
an exclusive NOR gate receiving the clock input signal and the feedback signal as inputs;
an inverter receiving the feedback signal as an input;
a first flip-flop receiving an input from the exclusive NOR gate and clocked by the output signal;
a first AND gate receiving inputs from the exclusive NOR gate and the first flip-flop;
at least one further flip-flop receiving an input from the first or a preceding flip-flop and clocked by the output signal; and
at least one further AND gate receiving inputs from the first or a preceding AND gate and the further flip-flop.

16. The phase alignment circuit portion as claimed in claim 13 wherein the phase alignment circuit comprises a plurality of flip-flops, each configured in a serial arrangement, receiving an input from the previous flip-flop.

17. The phase alignment circuit portion as claimed in claim 13 wherein the phase alignment circuit comprises a plurality of AND gates, receiving an input from the corresponding flip-flop and the previous AND gate.

18. The phase alignment circuit portion as claimed in claim 13 wherein the phase alignment circuits further comprises a final flip-flop, receiving inputs from the inverter and a final one of the AND gates.

19. The phase alignment circuit portion as claimed in claim 13 wherein the phase alignment circuit portion is arranged to be disabled once its control output is altered to provide the lock signal.

20. A method of starting-up the frequency synthesiser arrangement as claimed in claim 1 comprising the phase alignment circuit portion:
initially setting the control output so as to result in the second input being received by the voltage controlled oscillator;
determining the overlap of the clock input signal and the feedback signal; and
when the overlap of the clock input signal and the feedback signal is equal to or above a predetermined threshold, setting the control output so as to result in the first input being received by the voltage controlled oscillator.

21. A method of changing a mode of operation of the frequency synthesiser arrangement as claimed in claim 1 comprising:
providing a constant voltage to the voltage controlled oscillator;
the phase alignment circuit portion initially setting the control output so as to result in the second input being received by the voltage controlled oscillator, wherein the external reference voltage is lower than the constant voltage;
the phase alignment circuit portion determining the overlap of the clock input signal and the feedback signal; and
when the overlap of the clock input signal and the feedback signal is equal to or above a predetermined threshold, setting the control output so as to result in the first input being received by the voltage controlled oscillator.

* * * * *